US009412589B2

(12) United States Patent
Barge et al.

(10) Patent No.: US 9,412,589 B2
(45) Date of Patent: Aug. 9, 2016

(54) METHOD FOR FABRICATING NMOS AND PMOS TRANSISTORS ON A SUBSTRATE OF THE SOI, IN PARTICULAR FDSOI, TYPE AND CORRESPONDING INTEGRATED CIRCUIT

(71) Applicant: STMICROELECTRONICS (CROLLES 2) SAS, Crolles (FR)

(72) Inventors: David Barge, Grenoble (FR); Philippe Garnier, Meylan (FR); Yves Campidelli, Le Moutaret (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/501,639

(22) Filed: Sep. 30, 2014

(65) Prior Publication Data

US 2015/0108576 A1    Apr. 23, 2015

(30) Foreign Application Priority Data

Oct. 23, 2013  (FR) ..................... 13 60303

(51) Int. Cl.
| | |
|---|---|
| *H01L 21/8238* | (2006.01) |
| *H01L 27/092* | (2006.01) |
| *H01L 21/02* | (2006.01) |
| *H01L 27/12* | (2006.01) |
| *H01L 21/84* | (2006.01) |
| *H01L 29/417* | (2006.01) |
| *H01L 29/423* | (2006.01) |
| *H01L 29/66* | (2006.01) |
| *H01L 29/786* | (2006.01) |

(52) U.S. Cl.
CPC ...... *H01L 21/02609* (2013.01); *H01L 21/0262* (2013.01); *H01L 21/02532* (2013.01); *H01L 21/02576* (2013.01); *H01L 21/02579* (2013.01); *H01L 21/02636* (2013.01); *H01L 21/84* (2013.01); *H01L 27/1203* (2013.01); *H01L 29/41733* (2013.01); *H01L 29/42384* (2013.01); *H01L 29/66742* (2013.01); *H01L 29/78618* (2013.01)

(58) Field of Classification Search
CPC .................... H01L 21/8238; H01L 21/02609
See application file for complete search history.

(56) References Cited

U.S. PATENT DOCUMENTS

| | | | | |
|---|---|---|---|---|
| 6,087,235 | A  * | 7/2000 | Yu ....................... | H01L 29/0847 257/E21.43 |
| 8,546,203 | B1 * | 10/2013 | Cheng .................... | H01L 21/84 257/347 |
| 8,815,741 | B1 * | 8/2014 | Richter ................. | H01L 21/265 438/696 |
| 2004/0097047 | A1 | 5/2004 | Natzle et al. | |
| 2011/0037125 | A1 * | 2/2011 | Cheng .................... | H01L 21/84 257/351 |
| 2011/0227157 | A1 * | 9/2011 | Yang ................. | H01L 21/76232 257/347 |
| 2011/0233688 | A1 * | 9/2011 | Ren .................... | H01L 27/1203 257/408 |

(Continued)

*Primary Examiner* — Earl Taylor
(74) *Attorney, Agent, or Firm* — Allen, Dyer, Doppelt, Milbrath & Gilchrist, P.A.

(57) ABSTRACT

An integrated circuit includes an NMOS transistor and a PMOS transistor on different regions of an SOI substrate. Each transistor includes a gate region, multilayer lateral insulating regions against the sides of the gate region while also on the substrate. Each multilayer lateral insulating region includes an inclined portion sloping away from the substrate. Source and drain regions are on the substrate and are separated from the sides of the gate region by the corresponding multilayer lateral insulating region. The source and drain regions have an inclined portion resting against the inclined portion of the the lateral insulating region.

20 Claims, 2 Drawing Sheets

(56) References Cited

U.S. PATENT DOCUMENTS

| | | | | |
|---|---|---|---|---|
| 2011/0291202 A1* | 12/2011 | Cheng | ............... | H01L 21/26513 257/408 |
| 2012/0199912 A1* | 8/2012 | Flachowsky | ............ | H01L 28/20 257/365 |
| 2012/0211844 A1* | 8/2012 | Schloesser | ...... | H01L 21/823412 257/410 |
| 2012/0286364 A1* | 11/2012 | Cheng | ............. | H01L 21/823418 257/369 |
| 2012/0329285 A1* | 12/2012 | Wang | .................... | H01L 21/022 438/762 |
| 2013/0015525 A1* | 1/2013 | Cheng | ................ | H01L 21/0217 257/351 |
| 2013/0051128 A1* | 2/2013 | Lu | ......................... | G11C 5/063 365/154 |
| 2013/0187205 A1* | 7/2013 | Adam | ............ | H01L 21/823807 257/288 |
| 2013/0187230 A1* | 7/2013 | Yamamoto | ........ | H01L 29/78651 257/347 |
| 2013/0207244 A1* | 8/2013 | David | ............... | H01L 21/76254 257/632 |
| 2014/0024181 A1* | 1/2014 | Adam | ..................... | H01L 21/84 438/154 |
| 2014/0027818 A1* | 1/2014 | Asenov | ................... | H01L 29/78 257/192 |
| 2014/0035000 A1* | 2/2014 | Ontalus | ................. | H01L 29/665 257/192 |
| 2014/0048912 A1* | 2/2014 | Hohage | ............... | H01L 21/0217 257/635 |
| 2014/0131735 A1* | 5/2014 | Hoentschel | ............. | H01L 21/84 257/77 |
| 2014/0167164 A1* | 6/2014 | Adam | ............... | H01L 29/66545 257/347 |
| 2014/0175527 A1* | 6/2014 | Chang | ................ | H01L 29/6656 257/288 |
| 2015/0108576 A1* | 4/2015 | Barge | ..................... | H01L 21/84 257/351 |
| 2015/0255577 A1* | 9/2015 | Yin | ................... | H01L 21/76224 438/285 |

* cited by examiner

METHOD FOR FABRICATING NMOS AND PMOS TRANSISTORS ON A SUBSTRATE OF THE SOI, IN PARTICULAR FDSOI, TYPE AND CORRESPONDING INTEGRATED CIRCUIT

FIELD OF THE INVENTION

The invention relates to integrated circuits, and more particularly, to the fabrication of NMOS and PMOS transistors on a substrate of the silicon-on-insulator (SOI) type, and especially on a substrate of the fully-depleted silicon-on-insulator (FDSOI) type.

BACKGROUND OF THE INVENTION

A substrate of the silicon-on-insulator (SOI) type comprises a semiconductor film, such as silicon or an alloy of silicon (e.g., a silicon-germanium alloy), situated on top of a buried insulating layer. The buried insulating layer is commonly denoted by the acronym BOX (Buried-OXide), which is itself situated on top of a carrier substrate, such as a semiconductor well.

In FDSOI technology, the semiconductor film is totally depleted. In other words, it is composed of intrinsic semiconductor material. Its thickness is generally on the order of a few nanometers. Furthermore, the buried insulating layer is itself generally very thin, on the order of ten nanometers.

In view of the limited thickness of the semiconductor film, the source and drain regions of the transistors comprise portions that are raised with respect to the semiconductor film in such a manner as to ensure a suitable electrical connection between these regions and the channel region of the transistor.

Such raised source and drain regions (commonly denoted by those skilled in the art under the acronym RSD: Raised Source and Drain) are typically obtained by epitaxy. Epitaxial processes implement either intrinsic silicon combined with an implantation of dopants, or a doped epitaxial layer in-situ with suitable protection masks in such a manner as to differentiate the source and drain regions of the NMOS transistors and of the PMOS transistors.

The epitaxial regions need to be situated as close as possible to the channel to reduce the effective gate length. The epitaxial regions also need to be situated as far as possible from the edges of the gate to reduce the lateral stray capacitances.

As a consequence, the formation of the raised source and drain regions with appropriate shapes is a critical and costly step in fabrication of the transistors. Currently, faceted raised source and drain regions are formed. In other words, the faceted raised source and drain regions have an inclined profile such that the distance between the source or drain region and the corresponding lateral flank or sides of the gate region increases between the lower part of the epitaxial region and the upper part of this epitaxial region. Furthermore, the lateral insulating regions disposed on the sides of the gate region are formed by successively deposited layers.

The combination of these multilayer lateral insulating regions and faceted epitaxies implemented for each type of transistor (N or P) leads to very high costs. Furthermore, the use of faceted epitaxies to form the raised source and drain regions poses problems because the N and P doped in-situ epitaxies have different growth mechanisms. It is therefore particularly difficult to obtain optimum shapes for each N or P type of transistor. Furthermore, depending on the type of transistor, the epitaxies and faceted source or drain regions are exposed to a final etch of the lateral insulating region. This can lead to a local thinning of the channel which degrades the electrical behavior of the transistor.

SUMMARY OF THE INVENTION

According to one embodiment and its implementation, a method and a device are provided that offer a more efficient approach for the formation of the raised and faceted source and drain regions of the NMOS and PMOS transistors.

According to one aspect, a method is provided for the fabrication of at least one transistor of the NMOS type and of at least one transistor of the PMOS type, respectively on different regions of a substrate of the silicon-on-insulator type. The substrate may be a fully-depleted silicon-on-insulator type.

The method may comprise, for each transistor, forming on top of the substrate a gate region flanked by a first lateral insulating layer, and a first faceted epitaxial layer of a first semiconductor material on the substrate on either side of the first lateral insulating layer. This may be done in such a manner so as to form two first semiconductor blocks on the substrate on either side of the first lateral insulating layer. The first material may have a first type of conductivity, such as a P type of conductivity, adapted to a first type of transistor, such as a PMOS transistor. The first material may be identical for the two types of transistors (NMOS and PMOS).

In other words, the first faceted epitaxial layer may be carried out without carrying out a prior lithography step to protect one of the types of transistors, such as the NMOS transistors, for example.

The method may further comprise forming at least a second lateral insulating layer so as to fill in the gap between each first faceted block and the corresponding first lateral insulating layer and to cover the first faceted block. The at least a second lateral insulating layer may comprise several other lateral insulating layers. A multilayer lateral insulating region (or spacer) has thus been formed.

The method may further comprise, for each second type of transistor, for example the NMOS transistors, removing the portion of lateral insulating layer covering each first faceted block. A removal of each first faceted block may leave behind a multilayer lateral insulating region itself as a result of having a faceted profile.

The method may then also comprise forming an epitaxial layer on the semiconductor substrate of a second semiconductor material having a second type of conductivity opposite to the first. The second semiconductor material may be the N type of conductivity, for example. The epitaxial layer is formed in such a manner as to form at the location of the first faceted block a second faceted semiconductor block, for example of the N type, adapted to the second type of transistor, such as an NMOS transistor, and matching the faceted profile of the corresponding lateral insulating region.

As a result, the second semiconductor block may be faceted without having to use a faceted epitaxial layer. Furthermore, since the region of the second faceted block may be situated as close as possible to the channel, it is protected by the faceted lateral insulating region. Also, it is not exposed to the final etch of the insulating region aimed at removing the portion of lateral insulating layer covering each first block of each transistor of the first type, such as the P-type transistors, for example.

According to another aspect, an integrated circuit may comprise at least one transistor of the NMOS type and at least one transistor of the PMOS type, respectively, on different regions of a substrate of the silicon-on-insulator type. Each transistor may comprise, on top of the substrate, a gate region, two multilayer lateral insulating regions respectively resting against two sides of the gate region and resting on the substrate. Each may comprise an inclined portion sloping away from the substrate, a source region and a drain region each comprising a semiconductor block resting on the substrate, separated from the corresponding side of the gate region by the corresponding lateral insulating region and having an inclined portion resting against the inclined portion of the lateral insulating region.

The thickness at the foot of each lateral insulating region may be, for example, in the range between about 5-7 nanometers.

BRIEF DESCRIPTION OF THE DRAWINGS

Other advantages and features of the invention will become apparent upon examining the detailed description of non-limiting embodiments and their implementations, and from the appended drawings in which.

DETAILED DESCRIPTION OF THE PREFERRED EMBODIMENTS

Figure 1:
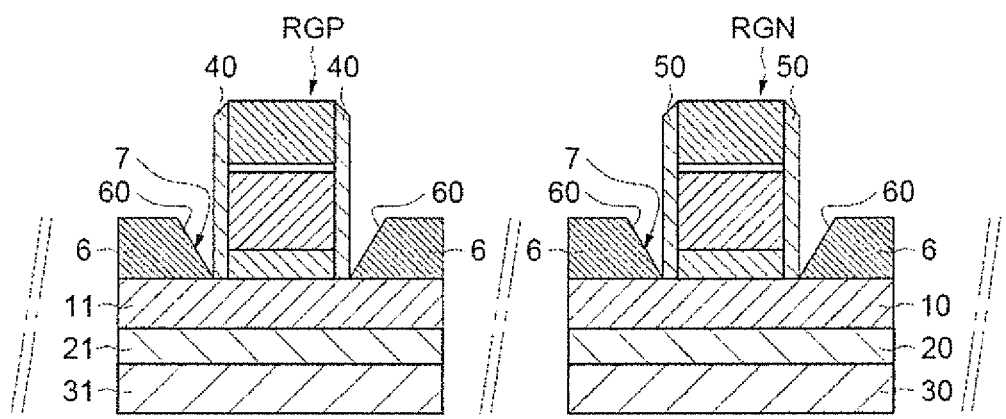
FIGS. 1 to 4 relate to various embodiments of the invention and their implementations.

In FIG. 1, the references 10 and 11 respectively denote different regions of a semiconductor substrate of the fully-depleted silicon-on-insulator (FDSOI) type.

The substrate is formed from a semiconductor film 10, 11 typically having a thickness on the order of a few nanometers. The semiconductor film 10, 11 rests on a layer of buried oxide 20, 21 commonly denoted by those skilled in the art using the acronym BOX. The buried insulating layer, typically silicon dioxide, itself rests on a carrier substrate 30, 31 which can be formed from a well.

A transistor NMOS will be fabricated on the substrate region 10, whereas on the substrate region 11, a PMOS transistor will be fabricated. The technological node is a 28 nm technological node, although the illustrated embodiments may be applied to more advanced technological nodes below 28 nm.

On top of the substrate region 10 and the substrate region 11, a gate region RGN and a gate region RGP are formed conventionally comprising a material with high permittivity (High-k), such as Hafnium-Silicon oxynitride (HfSiON), for example, onto which a metal stack is deposited, itself covered by amorphous silicon.

An architecture of the "gate first" type is typically used since the gate is formed prior to the formation of the source and drain regions. Subsequently and in a conventional manner, on the lateral sides of these two gate regions RGN and RGP, first insulating lateral layers 40 and 50 are formed. The first insulating lateral layers 40 and 50 are made of silicon nitride, for example.

For each of the transistors, whether it be the NMOS or PMOS, a first faceted selective epitaxial layer of a first semiconductor material is carried out in-situ on the substrate 10, 11 on either side of the first lateral layer 40, 50. This is done in such a manner so as to form two first faceted semiconductor blocks 6. The first semiconductor material may be in-situ P-doped silicon, for example. These blocks are faceted in the sense that they possess an inclined profile 60 sloping away from the substrate. In other words, the gap 7 between the inclined profile 60 and the corresponding lateral insulating layer 40, 50 increases in the direction moving away from the substrate 10, 11.

The selective and faceted epitaxial layer can be implemented between 500 and 750° C. The working pressure is typically between a few Torr and 200 Torr. In the case of an epitaxial layer of the SiGeB type, a mixture as follows may be used: $H_2$ (carrier gas)/dichlorosilane (DCS) and $GeH_4$ (precursors)/$B_2H_6$ (boron dopant precursor)/HCL (gas allowing the selectivity and modulating the appearance of the facets). Those skilled in the art will be able to adjust the various concentrations to obtain a desired morphology with the targeted doping.

By way of a non-limiting example, for a temperature of 642° C. and a total pressure of 20 Torr, the following partial pressures may be used:

$GeH_4$: $6.5 \cdot 10^{-3}$ Torr
$B_2H_6$: $4.6 \cdot 10^{-4}$ Torr
DCS $7.8 \cdot 10^{-2}$ Torr
$H_2$: 19.8 Torr
HCL: $1.6 \cdot 10^{-1}$ Torr Other carrier gases (e.g., $N_2$), precursors (e.g., $SiH_4$, $Si_2H_6$), dopant, or selectivity regulators (e.g., $CL_2$) may also be used.

It should be noted that, according to this method, no prior lithography is carried out to protect one or the other of the transistors.

Figure 2:
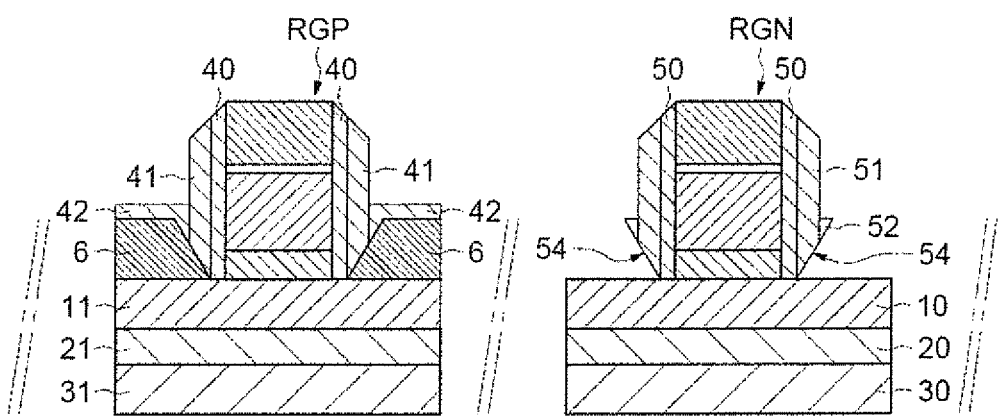

As illustrated in FIG. 2, at least a second lateral insulating layer 41, 51 is formed, and in the present case a third lateral insulating layer 42, 52 is also formed. This is done in such a manner as to fill in the gap 7 between each first block 6 and the first lateral insulating layer 40, 50. The final lateral insulating layer deposited 42, 52 also covers the upper part of the corresponding first faceted semiconductor block 6.

After having protected the structure intended to form the future transistor PMOS, for example by a patterned photoresist, the portion of the lateral insulating layer 52 covering the two first epitaxial layer blocks 6 of the future NMOS transistor is removed using a selective etch.

Such an etch can be of the "wet" etch type (for example ammonia and hydrogen peroxide diluted in water: this mixture is known by those skilled in the art under the acronym SC1) or else a "dry" etch, for example a radiofrequency plasma with gas mixtures such as $CH_3F/O_2$/Ar or He).

As illustrated in FIG. 2, a lateral insulating region 50, 51, 52 comprising a faceted profile 54 is then obtained.

Figure 3:
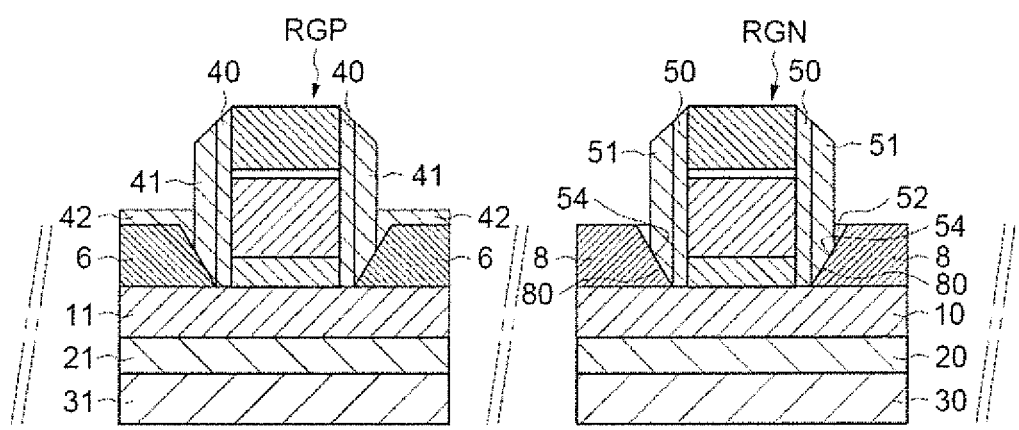

Subsequently, as illustrated in FIG. 3, an epitaxial layer of a second semiconductor material is carried out, for example in-situ N-doped silicon, in such a manner as to form, instead of the first faceted block 6, a second faceted block 8 whose inclined profile 80 matches the inclined profile 54 of the insulating region 50, 51, 52.

It will be noted here that this second epitaxial layer is not a faceted epitaxial layer but a conventional epitaxial layer or less faceted than the preceding one. Since the spacer (insulating regions 50, 51, 52) has itself adopted the shape left by the first, more aggressive, epitaxial layer, a source/drain region flush with the spacer is then obtained with the second epitaxial layer.

This type of epitaxial layer differs from a highly faceted epitaxial layer by a modulation of the ratio between the various precursor gases and/or of the process temperature which has an influence on the relative speeds between the various facets, and hence, their appearance on the final morphology.

By way of a non-limiting example, an epitaxial layer of the N type could be carried out at a temperature of 700° C. and a total pressure of 300 Torr using the following gases and the partial pressures:

DCS: 5 Torr
$H_2$: 293.5 Torr
$PH_3$: 0.2 Torr
HCL: 1.3 Torr

Figure 4:
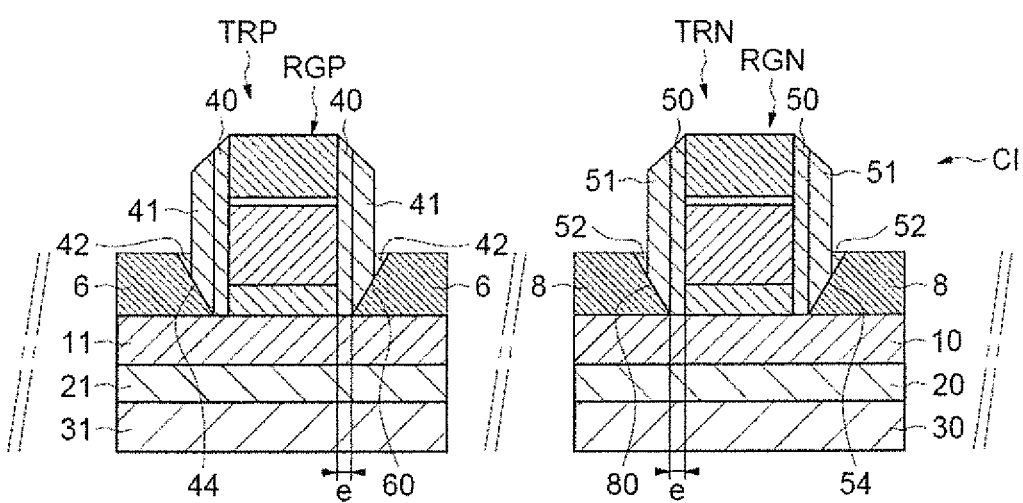

As illustrated in FIG. 4, the portion of the insulating lateral layer 42 covering the first two faceted blocks 6 of the PMOS transistor TRP is etched away.

As illustrated in FIG. 4, an integrated circuit CI is therefore obtained comprising at least one PMOS transistor TRP and at least one NMOS transistor TRN respectively fabricated on different regions 10, 11 of a substrate of the silicon-on-insulator type. Each transistor comprises, on top of the substrate, a gate region RGP, RGN, two multilayer lateral insulating regions 40-42, 50-52 respectively resting against two sides of the corresponding gate region RGP, RGN. Each of the lateral insulating regions possesses an inclined portion 44, 54 which is sloping away from the substrate.

Each transistor includes a source region and a drain region each comprising a semiconductor block 6 (for the transistor TRP) and a semiconductor block 8 (for the transistor TRN) on the substrate, and separated from the corresponding side of the gate region by the corresponding lateral insulating regions 40-42, 50-52.

Each source and drain semiconductor block includes an inclined portion 60, 80 resting against the inclined portion 44, 54 of the corresponding lateral insulating region.

The illustrated integrated circuit is fabricated using a 28 nanometer technology, and the space at the base of each lateral insulating region is within a range of about 5-7 nanometers.

The invention according to this aspect notably allows an effective control of the faceted profile of the source and drain regions for the two types of transistors (N or P) while reducing the risk of localized etching of the channel region at the base of the gate region. This may be accomplished while at the same time saving one lithography step (since the first faceted epitaxial layer is carried out for the two types of transistors without protection of one of the two types).

In the above description, the first epitaxial layer may be an epitaxial layer of the P type adapted to PMOS transistors, but a faceted epitaxial layer of the N type could have been carried out adapted to NMOS transistors. Subsequently, what has been described hereinbefore for the NMOS transistor could have been carried out on the future PMOS transistor.

The invention claimed is:

1. A method for forming at least one NMOS transistor and at least one PMOS transistor, respectively, on different regions of a silicon-on-insulator (SOI) substrate, comprising:
   forming a first gate region on a first region of the SOI substrate, and a second gate region on a second region of the SOI substrate;
   forming a first lateral insulating layer on sidewalls of the first and second gate regions;
   forming on the first and second regions of the SOI substrate a respective pair of first faceted semiconductor blocks of a first semiconductor material adjacent the first lateral insulating layers, with a gap being formed between an inclined profile of each first faceted semiconductor block and a corresponding first lateral insulating layer, the first semiconductor material having a first type of conductivity for a first type of transistor;
   forming second and third lateral insulating layers on sidewalls of the first lateral insulating layer and on the first faceted semiconductor blocks for the first and second regions of the SOI substrate, with the second and third lateral insulating layers having a faceted profile and filling the gaps between the inclined profile of each first faceted semiconductor block and the corresponding first lateral insulating layer;
   removing, from the second region of the SOI substrate, the pair of first faceted semiconductor blocks and a portion of the second and third lateral insulating layers so that the remaining second and third lateral insulating layers have a faceted profile; and
   forming on the second region of the SOI substrate a pair of second faceted semiconductor blocks of a second semiconductor material at a location where the pair of first faceted semiconductor blocks were removed, with the pair of second faceted semiconductor blocks matching a faceted profile of the corresponding first lateral insulating region and the second and third lateral insulating layers, the second semiconductor material having a second type of conductivity opposite the first type of conductivity for a second type of transistor;
   with each pair of the first and second faceted semiconductor blocks having an upper surface coplanar with an upper surface of the third lateral insulating layer.

2. The method according to claim 1, further comprising removing, from the first region of the SOI substrate, a portion of the second and second lateral insulating layers so that the remaining second and third lateral insulating layers have a faceted profile.

3. The method according to claim 1, wherein the substrate comprises a fully-depleted silicon-on-insulator substrate.

4. The method according to claim 1, wherein the first type of transistor for the first region of the SOI substrate comprises a PMOS transistor, and the second type of transistor for the second region of the SOI substrate comprises an NMOS transistor.

5. The method according to claim 1, wherein the first type of transistor for the first region of the SOI substrate comprises an NMOS transistor, and the second type of transistor for the second region of the SOI substrate comprises a PMOS transistor.

6. The method according to claim 1, wherein the first pair of faceted semiconductor blocks are epitaxially formed.

7. The method according to claim 1, wherein the second pair of faceted semiconductor blocks are epitaxially formed.

8. A method for making a semiconductor device comprising:
   forming a first gate region on a first region of a substrate, and a second gate region on a second region of the substrate;
   forming a first lateral insulating layer on sidewalls of the first and second gate regions;
   forming on the first and second regions of the substrate a respective pair of first faceted semiconductor blocks of a first semiconductor material adjacent the first lateral insulating layers, with a gap being formed between an inclined profile of each first faceted semiconductor block and a corresponding first lateral insulating layer, the first semiconductor material having a first type of conductivity for a first type of transistor;
   forming second and third lateral insulating layers on sidewalls of the first lateral insulating layer and on the first faceted semiconductor blocks for the first and second regions of the substrate, with the second and third lateral insulating layers having a faceted profile and filling the gaps between the inclined profile of each first faceted semiconductor block and the corresponding first lateral insulating layer;
   removing, from the second region of the substrate, the pair of first faceted semiconductor blocks and a portion of the second and third lateral insulating layers so that the remaining second and third lateral insulating layers have a faceted profile; and
   forming on the second region of the substrate a pair of second faceted semiconductor blocks of a second semiconductor material at a location where the pair of first faceted semiconductor blocks were removed, with the pair of second faceted semiconductor blocks matching a faceted profile of the corresponding first lateral insulating region and the second and third lateral insulating layers, the second semiconductor material having a second type of conductivity opposite the first type of conductivity for a second type of transistor;

with each pair of the first and second faceted semiconductor blocks having an upper surface coplanar with an upper surface of the third lateral insulating layer.

9. The method according to claim 8, further comprising removing, from the first region of the substrate, a portion of the second and third lateral insulating layers so that the remaining second and third lateral insulating layers have a faceted profile.

10. The method according to claim 8, wherein the substrate comprises a fully-depleted silicon-on-insulator substrate.

11. The method according to claim 8, wherein the first type of transistor for the first region of the substrate comprises a PMOS transistor, and the second type of transistor for the second region of the substrate comprises an NMOS transistor.

12. The method according to claim 8, wherein the first type of transistor for the first region of the substrate comprises an NMOS transistor, and the second type of transistor for the second region of the substrate comprises a PMOS transistor.

13. The method according to claim 8, wherein the first pair of faceted semiconductor blocks are epitaxially formed.

14. The method according to claim 8, wherein the second pair of faceted semiconductor blocks are epitaxially formed.

15. An integrated circuit comprising:
a substrate comprising first and second regions;
at least one first type of transistor on the first region;
at least one second type of transistor on the second region; and
said at least one first and second type of transistors each comprising
a gate region,
a multilayer lateral insulating region on sidewalls of said gate region and on said substrate, said multilayer lateral insulating region comprising an inclined portion sloping away from said gate region, and
source and drain regions on said substrate, separated from said gate region by a corresponding multilayer lateral insulating region and having an inclined portion contacting the inclined portion of the said multilayer lateral insulating region, with each source and drain region having an upper surface coplanar with an upper surface of one of the layers from the corresponding multilayer lateral insulating region.

16. The integrated circuit according to claim 15, wherein said at least one first type of transistor on the first region of said substrate comprises a PMOS transistor, and said at least one second type of transistor on the second region of said substrate comprises an NMOS transistor.

17. The integrated circuit according to claim 15, wherein said source and drain regions are epitaxially formed.

18. The integrated circuit according to claim 15, wherein a thickness at a base of each multilayer lateral insulating region is within a range of about 5-7 nm.

19. The integrated circuit according to claim 15, wherein said substrate comprises a fully-depleted SOI substrate.

20. The integrated circuit according to claim 15, wherein a length of said gate region for said at least one first and second types of transistors is 28 nm or less.

* * * * *